United States Patent
Cao et al.

(10) Patent No.: US 10,529,770 B2
(45) Date of Patent: Jan. 7, 2020

(54) METHODS OF MAKING SEMICONDUCTOR X-RAY DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/038,472

(22) Filed: Jul. 18, 2018

(65) Prior Publication Data
US 2018/0342554 A1 Nov. 29, 2018

Related U.S. Application Data

(63) Continuation of application No. 15/309,059, filed as application No. PCT/CN2015/083636 on Jul. 9, 2015, now Pat. No. 10,056,425.

(51) Int. Cl.
| | |
|---|---|
| *H01L 27/146* | (2006.01) |
| *H01L 31/18* | (2006.01) |
| *H01L 31/02* | (2006.01) |
| *H01L 31/0224* | (2006.01) |
| *H01L 31/0304* | (2006.01) |
| *H01L 31/115* | (2006.01) |
| *H02S 40/44* | (2014.01) |
| *H01L 31/09* | (2006.01) |
| *G01T 1/24* | (2006.01) |

(52) U.S. Cl.
CPC .... *H01L 27/14661* (2013.01); *H01L 27/1469* (2013.01); *H01L 27/14636* (2013.01); *H01L 27/14659* (2013.01); *H01L 27/14694* (2013.01); *H01L 31/02005* (2013.01); *H01L 31/022408* (2013.01); *H01L 31/0304* (2013.01); *H01L 31/115* (2013.01); *H01L 31/184* (2013.01); *H01L 31/1892* (2013.01); *H02S 40/44* (2014.12); *G01T 1/24* (2013.01); *H01L 31/09* (2013.01)

(58) Field of Classification Search
None
See application file for complete search history.

(56) References Cited

U.S. PATENT DOCUMENTS

| | | | |
|---|---|---|---|
| 2006/0027757 A1* | 2/2006 | Sato | G01T 1/24 250/370.09 |
| 2013/0264481 A1 | 10/2013 | Chern et al. | |

FOREIGN PATENT DOCUMENTS

| | | |
|---|---|---|
| EP | 2363887 A1 | 9/2011 |
| JP | 2002217444 A | 8/2002 |
| JP | 2013142578 A | 7/2013 |
| TW | 201513329 A | 4/2015 |

* cited by examiner

*Primary Examiner* — Asok K Sarkar
(74) *Attorney, Agent, or Firm* — IPro, PLLC; Qian Gu

(57) ABSTRACT

Disclosed herein is an apparatus comprising: an X-ray absorption layer; a first electrical contact and a second electrical contact on opposing surfaces of the X-ray absorption layer; wherein the first electrical contact and the second electrical contact respectively comprise structures extending into the X-ray absorption layer.

13 Claims, 27 Drawing Sheets

METHODS OF MAKING SEMICONDUCTOR X-RAY DETECTOR

TECHNICAL FIELD

The disclosure herein relates to X-ray detectors, particularly relates to methods of making semiconductor X-ray detectors.

BACKGROUND

X-ray detectors may be devices used to measure the flux, spatial distribution, spectrum or other properties of X-rays.

X-ray detectors may be used for many applications. One important application is imaging. X-ray imaging is a radiography technique and can be used to reveal the internal structure of a non-uniformly composed and opaque object such as the human body.

Early X-ray detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to X-ray, electrons excited by X-ray are trapped in the color centers until they are stimulated by a laser beam scanning over the plate surface. As the plate is scanned by laser, trapped excited electrons give off light, which is collected by a photomultiplier tube. The collected light is converted into a digital image. In contrast to photographic plates and photographic films, PSP plates can be reused.

Another kind of X-ray detectors are X-ray image intensifiers. Components of an X-ray image intensifier are usually sealed in a vacuum. In contrast to photographic plates, photographic films, and PSP plates, X-ray image intensifiers may produce real-time images, i.e., do not require post-exposure processing to produce images. X-ray first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident X-ray. The emitted electrons are projected, through electron optics, onto an output phosphor and cause the output phosphor to produce a visible-light image.

Scintillators operate somewhat similarly to X-ray image intensifiers in that scintillators (e.g., sodium iodide) absorb X-ray and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of X-ray. A scintillator thus has to strike a compromise between absorption efficiency and resolution.

Semiconductor X-ray detectors largely overcome this problem by direct conversion of X-ray into electric signals. A semiconductor X-ray detector may include a semiconductor layer that absorbs X-ray in wavelengths of interest. When an X-ray photon is absorbed in the semiconductor layer, multiple charge carriers (e.g., electrons and holes) are generated and swept under an electric field towards electrical contacts on the semiconductor layer. Cumbersome heat management required in currently available semiconductor X-ray detectors (e.g., Medipix) can make a detector with a large area and a large number of pixels difficult or impossible to produce.

SUMMARY

Disclosed herein is a method of making an apparatus suitable for detecting x-ray, the method comprising: attaching a chip comprising an X-ray absorption layer to a surface of a substrate, wherein the surface is electrically conductive; thinning the chip; forming an electrical contact in the chip; bonding an electronic layer to the chip such that the electrical contact of the chip is electrically connected to an electrical contact of the electronic layer.

According to an embodiment, the substrate is not removed from the chip.

According to an embodiment, the substrate has a mass attenuation coefficient less than 1000 $m^2$/kg for X-ray.

According to an embodiment, the substrate comprises silicon, glass, silicon oxide, Al, Cr, Ti, or a combination thereof.

According to an embodiment, thinning comprises reducing a thickness of the chip to 200 microns or less, 100 microns or less, or 50 microns or less.

According to an embodiment, the chip comprises GaAs.

According to an embodiment, the GaAs is not doped with chromium.

According to an embodiment, attaching the chip to the surface of the substrate comprises depositing a layer of metal to the chip.

According to an embodiment, the method further comprises forming a diode in the chip.

According to an embodiment, the method further comprises forming discrete electrical contacts on the chip.

Disclosed herein is a method of making an apparatus suitable for detecting x-ray, the method comprising: attaching a chip comprising an X-ray absorption layer to a surface of a substrate, wherein the surface is electrically conductive, wherein the chip comprises a sacrificial substrate, a second doped region on the sacrificial substrate; exposing the second doped region by removing the sacrificial substrate; forming an electrical contact on the second doped region; bonding an electronic layer to the chip such that the electrical contact of the chip is electrically connected to an electrical contact of the electronic layer.

According to an embodiment, the method further comprises an etch stop layer between the sacrificial substrate and the second doped region.

According to an embodiment, the method further comprises an intrinsic region, wherein the intrinsic region and the sacrificial substrate sandwich the second doped region.

According to an embodiment, the intrinsic region has a thickness of less than 75 microns, less than 100 microns, less than 125 microns, or less than 200 microns.

According to an embodiment, the method further comprises a lightly doped region, wherein the lightly doped region and the sacrificial substrate sandwich the second doped region.

According to an embodiment, the lightly doped region has a thickness of less than 75 microns, less than 100 microns, less than 125 microns, or less than 200 microns.

According to an embodiment, the second doped region is an epitaxial layer.

According to an embodiment, the method further comprises a first doped region, wherein the second doped region is sandwiched between the first doped region and the sacrificial substrate.

According to an embodiment, the first doped region is heavily doped.

According to an embodiment, the first doped region is an epitaxial layer.

According to an embodiment, the first and second doped regions form a diode.

According to an embodiment, the electric contact of the chip comprises structures extending into the X-ray absorption layer.

DETAILED DESCRIPTION

Figure 1A:
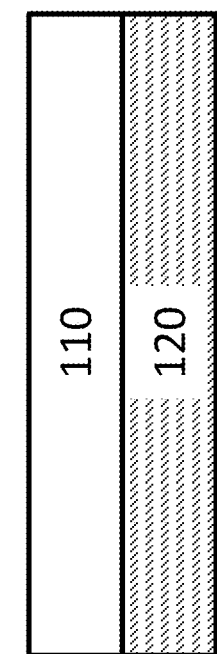
FIG. 1A schematically shows a cross-sectional view of the detector, according to an embodiment.

FIG. 1A schematically shows a cross-sectional view of the detector 100, according to an embodiment. The detector 100 may include an X-ray absorption layer 110 and an electronics layer 120 (e.g., an ASIC) for processing or analyzing electrical signals incident X-ray generates in the X-ray absorption layer 110. In an embodiment, the detector 100 does not comprise a scintillator. The X-ray absorption layer 110 may include a semiconductor material such as, silicon, germanium, GaAs, CdTe, CdZnTe, or a combination thereof. The semiconductor may have a high mass attenuation coefficient for the X-ray energy of interest.

Figure 1B:
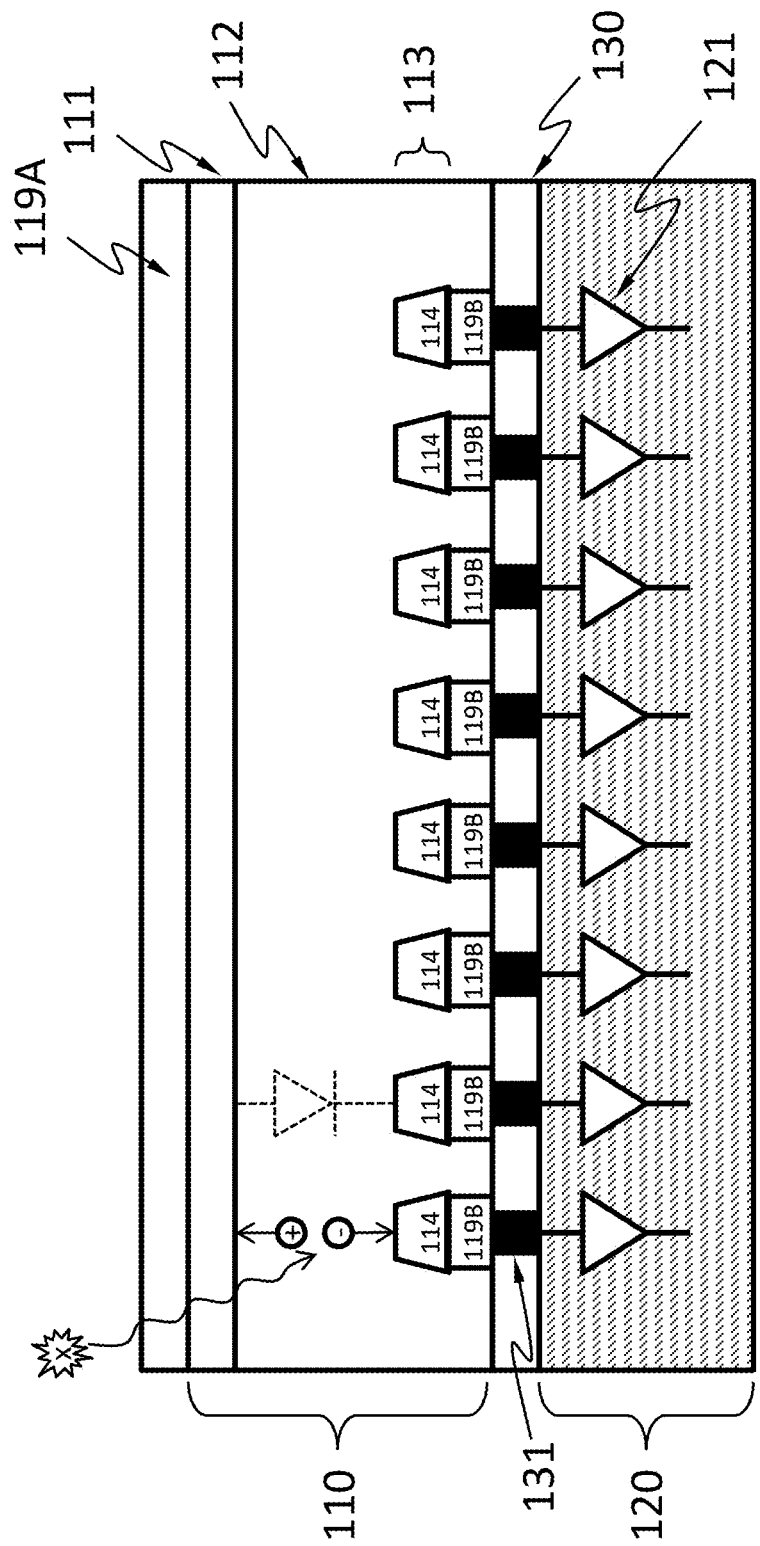
FIG. 1B schematically shows a detailed cross-sectional view of the detector, according to an embodiment.

As shown in a detailed cross-sectional view of the detector 100 in FIG. 1B, according to an embodiment, the X-ray absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete portions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 1B, each of the discrete regions 114 of the second doped region 113 forms a diode with the first doped region 111 and the optional intrinsic region 112. Namely, in the example in FIG. 1B, the X-ray absorption layer 110 has a plurality of diodes having the first doped region 111 as a shared electrode. The first doped region 111 may also have discrete portions.

When an X-ray photon hits the X-ray absorption layer 110 including diodes, the X-ray photon may be absorbed and generate one or more charge carriers by a number of mechanisms. An X-ray photon may generate 10 to 100000 charge carriers. The charge carriers may drift to the electrodes of one of the diodes under an electric field. The field may be an external electric field. The electrical contact 119B may include discrete portions each of which is in electrical contact with the discrete regions 114. In an embodiment, the charge carriers may drift in directions such that the charge carriers generated by a single X-ray photon are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by an X-ray photon incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by an X-ray photon incident therein flow to the discrete region 114. Namely, less than 2%, less than 1%, less than 0.1%, or less than 0.01% of these charge carriers flow beyond the pixel.

Figure 1C:
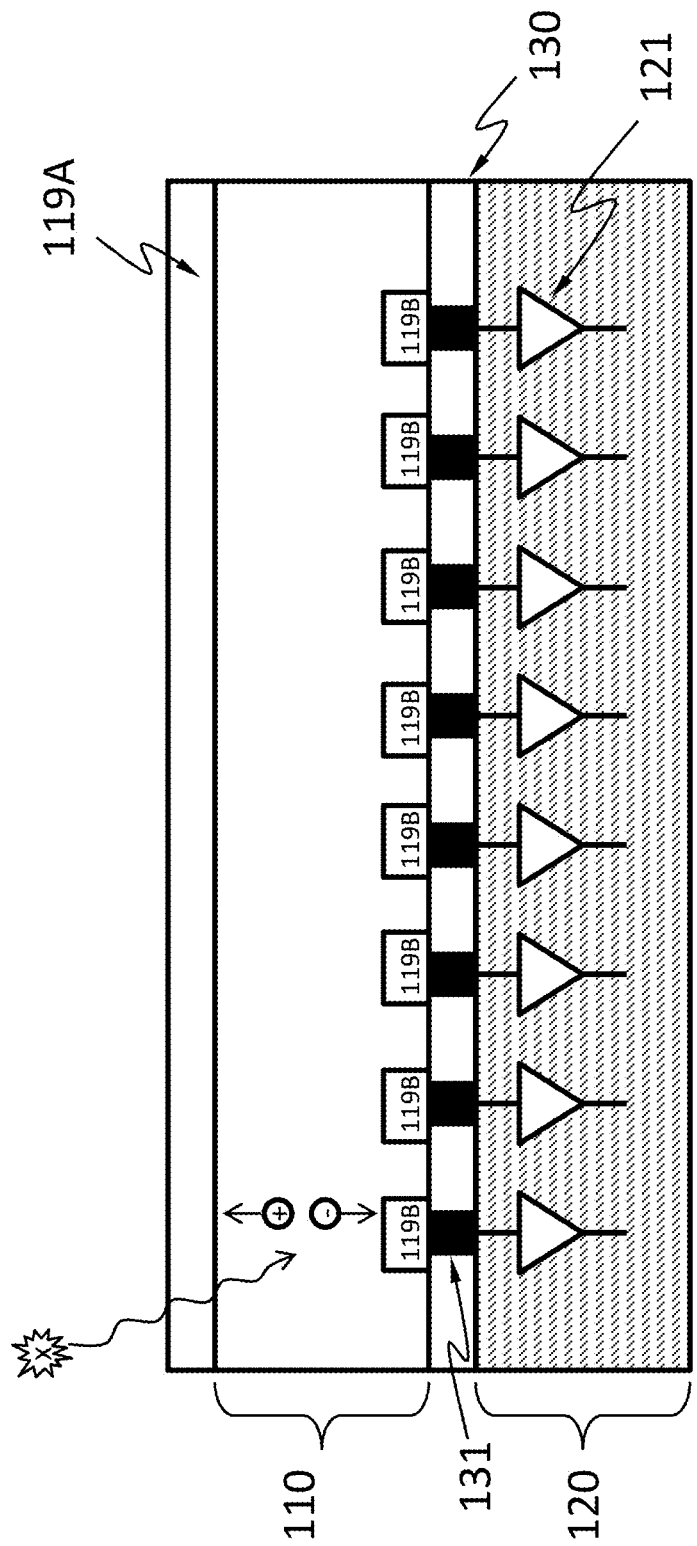
FIG. 1C schematically shows an alternative detailed cross-sectional view of the detector, according to an embodiment.

As shown in an alternative detailed cross-sectional view of the detector 100 in FIG. 1C, according to an embodiment, the X-ray absorption layer 110 may include a resistor of a semiconductor material such as, silicon, germanium, GaAs, CdTe, CdZnTe, or a combination thereof, but does not include a diode. The semiconductor may have a high mass attenuation coefficient for the X-ray energy of interest.

When an X-ray photon hits the X-ray absorption layer 110 including a resistor but not diodes, it may be absorbed and generate one or more charge carriers by a number of mechanisms. An X-ray photon may generate 10 to 100000 charge carriers. The charge carriers may drift to the electrical contacts 119A and 119B under an electric field. The field may be an external electric field. The electrical contact 119B includes discrete portions. In an embodiment, the charge carriers may drift in directions such that the charge carriers generated by a single X-ray photon are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by an X-ray photon incident around the footprint of one of these discrete portions of the electrical contact 119B are not substantially shared with another of these discrete portions of the electrical contact 119B. A pixel 150 associated with a discrete portion of the electrical contact 119B may be an area around the discrete portion in which substantially all (more than 98%, more than 99.5%, more than 99.9% or more than 99.99% of) charge carriers generated by an X-ray photon incident therein flow to the discrete portion of the electrical contact 119B. Namely, less than 2%, less than 0.5%, less than 0.1%, or less than 0.01% of these charge carriers flow beyond the pixel associated with the one discrete portion of the electrical contact 119B.

The electronics layer 120 may include an electronic system 121 suitable for processing or interpreting signals generated by X-ray photons incident on the X-ray absorption layer 110. The electronic system 121 may include an analog circuitry such as a filter network, amplifiers, integrators, and comparators, or a digital circuitry such as a microprocessors, and memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the X-ray absorption layer 110. Other bonding techniques are possible to connect the electronic system 121 to the pixels without using vias. The electronic system 121 may be configured to count X-ray photons by the pixels or configured to measure the amounts of charge carriers accumulated at the pixels (e.g., by using an analog-to-digital converter (ADC) shared by the pixels).

Figure 1D:
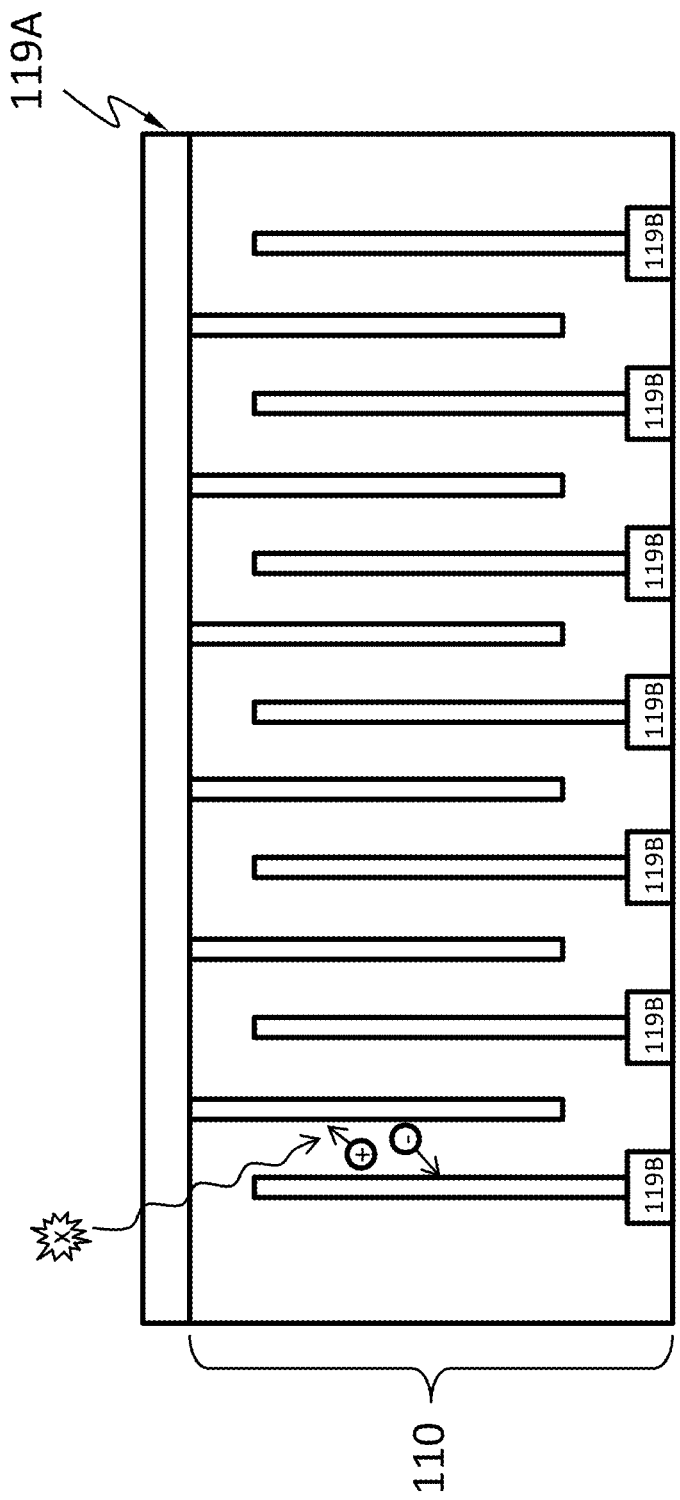
FIG. 1D schematically shows that the electrical contacts on the X-ray absorption layer may have structures extending into the X-ray absorption layer.

FIG. 1D schematically shows that the electrical contacts 119A and 119B may have structures extending into the X-ray absorption layer 110. For example, the structures may be holes are drilled into the X-ray absorption layer 110 (e.g., by deep reactive-ion etching (DRIE) or laser and filled with a metal. The structures may form an Ohmic contact or a Schottky contact with the materials of the X-ray absorption layer 110. The structures of the electrical contacts 119A and the structures of the electrical contacts 119B may form an interdigitate pattern but should not electrically short. These structures may help collecting charge carriers generated from an X-ray photon. The charge carriers only need to drift to one of these structures rather than the surfaces of the X-ray absorption layer 110, thereby reducing the chance of recombination or trapping. Each of the structures of the electrical contacts 119B may be spaced by a short distance (e.g., 20 µm, 50 µm or 100 µm) from the nearest one of the structures of the electrical contacts 119A. The time for the charge carriers to be collected by these structures may be on the order of 0.1-1 ns.

Figure 2:
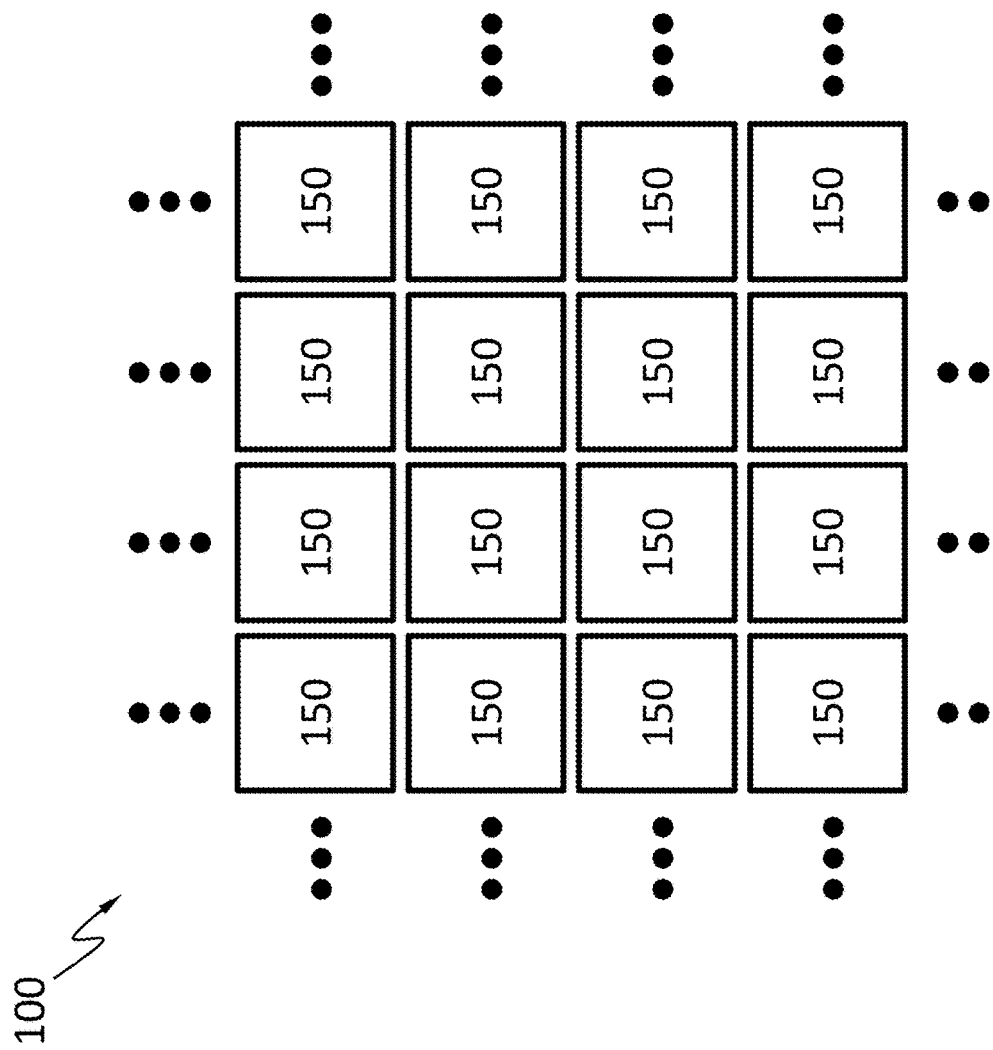
FIG. 2 schematically shows that the device may have an array of pixels, according to an embodiment.

FIG. 2 schematically shows that the detector 100 may have an array of pixels 150. The array may be a rectangular array, a honeycomb array, a hexagonal array or any other suitable array. Each pixel 150 may be configured to detect an X-ray photon incident thereon, measure the energy of the X-ray photon, or both. For example, each pixel 150 may be configured to count numbers of X-ray photons incident thereon whose energy falls in a plurality of bins, within a period of time. All the pixels 150 may be configured to count the numbers of X-ray photons incident thereon within a plurality of bins of energy within the same period of time. Each pixel 150 may have its own analog-to-digital converter (ADC) configured to digitize an analog signal representing the energy of an incident X-ray photon into a digital signal. The ADC may have a resolution of 10 bits or higher. Each pixel 150 may be configured to measure its dark current, such as before or concurrently with each X-ray photon incident thereon. Each pixel 150 may be configured to deduct the contribution of the dark current from the energy of the X-ray photon incident thereon. The pixels 150 may be configured to operate in parallel. For example, when one pixel 150 measures an incident X-ray photon, another pixel 150 may be waiting for an X-ray photon to arrive. The pixels 150 may be but do not have to be individually addressable.

Figure 3A:
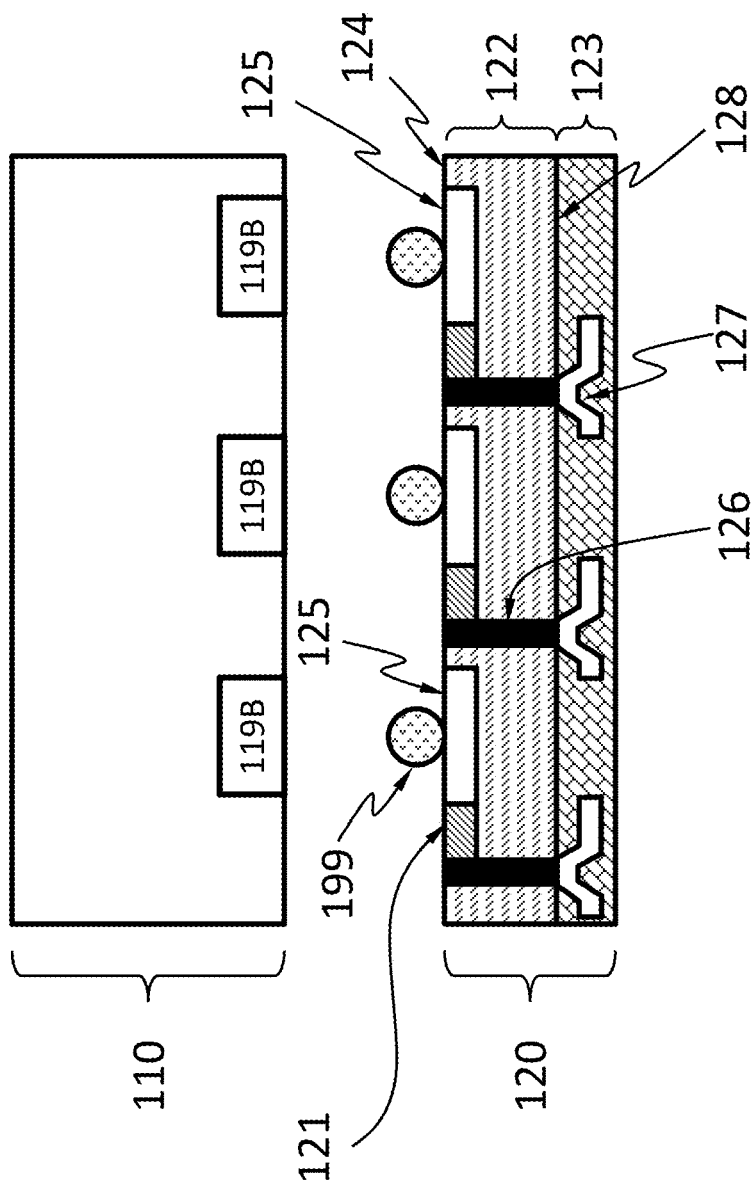
FIG. 3A schematically shows the electronics layer, according to an embodiment.

FIG. 3A schematically shows the electronics layer 120 according to an embodiment. The electronic layer 120 comprises a substrate 122 having a first surface 124 and a second surface 128. A "surface" as used herein is not necessarily exposed, but can be buried wholly or partially. The electronic layer 120 comprises one or more electric contacts 125 on the first surface 124. The one or more electric contacts 125 may be configured to be electrically connected to one or more electrical contacts 119B of the X-ray absorption layer 110. The electronics system 121 may be in or on the substrate 122. The electronic layer 120 comprises one or more vias 126 extending from the first surface 124 to the second surface 128. The electronic layer 120 may comprise a redistribution layer (RDL) 123 on the second surface 128. The RDL 123 may comprise one or more transmission lines 127. The electronics system 121 is electrically connected to the electric contacts 125 and the transmission lines 127 through the vias 126.

The substrate 122 may be a thinned substrate. For example, the substrate may have at thickness of 750 microns or less, 200 microns or less, 100 microns or less, 50 microns or less, 20 microns or less, or 5 microns or less. The substrate 122 may be a silicon substrate or a substrate or other suitable semiconductor or insulator. The substrate 122 may be produced by grinding a thicker substrate to a desired thickness.

The one or more electric contacts 125 may be a layer of metal or doped semiconductor. For example, the electric contacts 125 may be gold, copper, platinum, palladium, doped silicon, etc.

The vias 126 pass through the substrate 122 and electrically connect electrical components (e.g., the electrical contacts 125) on the first surface 124 to electrical components (e.g., the RDL) on the second surface 128. The vias 126 are sometimes referred to as "through-silicon vias" although they may be fabricated in substrates of materials other than silicon.

The RDL 123 may comprise one or more transmission lines 127. The transmission lines 127 electrically connect electrical components (e.g., the vias 126) in the substrate 122 to bonding pads at other locations on the substrate 122. The transmission lines 127 may be electrically isolated from the substrate 122 except at certain vias 126 and certain bonding pads. The transmission lines 127 may be a material (e.g., Al) with small mass attenuation coefficient for the X-ray energy of interest. The RDL 123 may redistribute electrical connections to more convenient locations. The RDL 123 is especially useful when the detector 100 has a large number of pixels. If the detector 100 does not have a large number of pixels, the RDL 123 may be omitted and signals from the pixels may be routed on the first surface 124.

FIG. 3A further schematically shows bonding between the X-ray absorption layer 110 and the electronic layer 120 at the electrical contact 119B and the electrical contacts 125. The bonding may be by a suitable technique such as direct bonding or flip chip bonding.

Direct bonding is a wafer bonding process without any additional intermediate layers (e.g., solder bumps). The bonding process is based on chemical bonds between two surfaces. Direct bonding may be at elevated temperature but not necessarily so.

Flip chip bonding uses solder bumps 199 deposited onto contact pads (e.g., the electrical contact 119B of the X-ray absorption layer 110 or the electrical contacts 125). Either the X-ray absorption layer 110 or the electronic layer 120 is flipped over and the electrical contact 119B of the X-ray absorption layer 110 are aligned to the electrical contacts 125. The solder bumps 199 may be melted to solder the electrical contact 119B and the electrical contacts 125 together. Any void space among the solder bumps 199 may be filled with an insulating material.

Figure 3B:
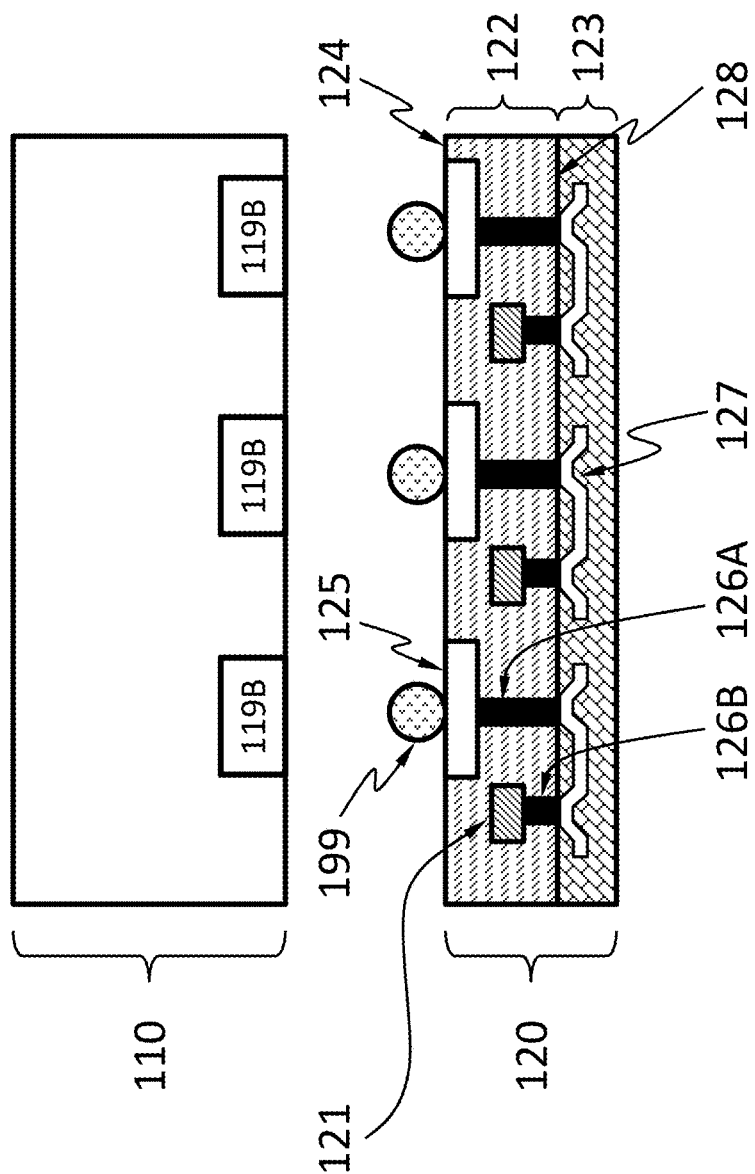
FIG. 3B schematically shows the electronics layer, according to an embodiment.

FIG. 3B schematically shows the electronics layer 120 according to an embodiment. The electronics layer 120 shown in FIG. 3B is different from the electronics layer 120 shown in FIG. 3A in the following ways. The electronics system 121 is buried in the substrate 122. The electronic layer 120 comprises one or more vias 126A extending from the first surface 124 to the second surface 128. The vias 126A electrically connect the electrical contacts 125 to the transmission lines 127 in the RDL 123 on the second surface 128. The electronic layer 120 further comprises one or more vias 126B extending from the second surface 128 to the electronics system 121. The vias 126B electrically connect the transmission lines 127 to the electronics system 121. The X-ray absorption layer 110 and the electronic layer 120 may also be bonded together (e.g., at the electrical contact 119B and the electrical contacts 125) by a suitable technique such as direct bonding or flip chip bonding.

Figure 3C:
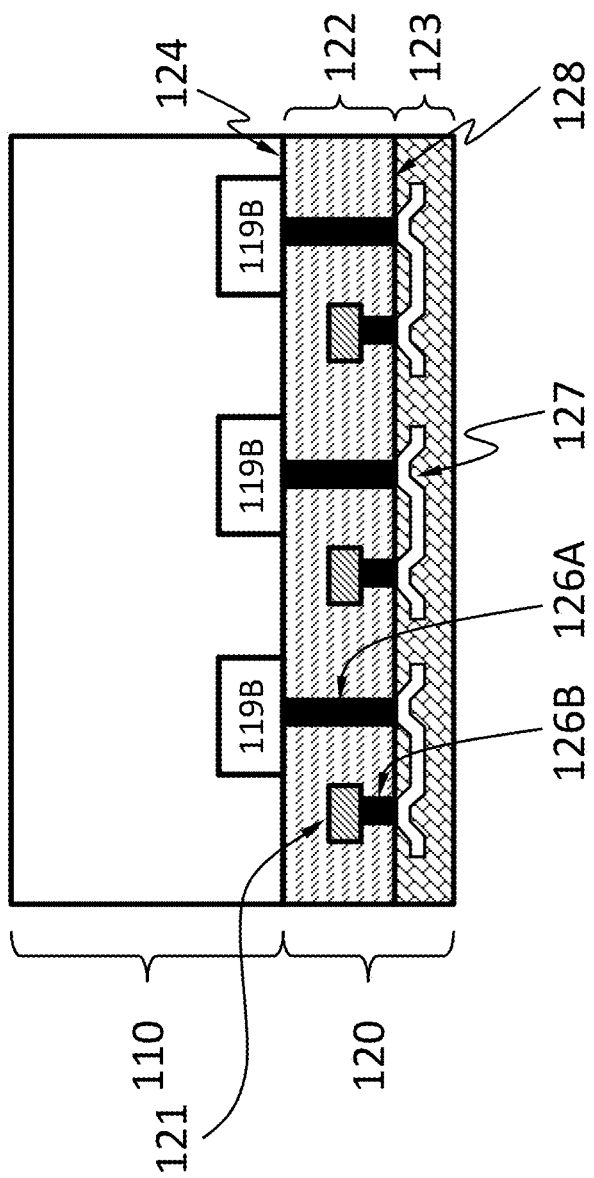
FIG. 3C schematically shows the electronics layer, according to an embodiment.

FIG. 3C schematically shows the electronics layer 120 according to an embodiment. The electronics layer 120 shown in FIG. 3C is different from the electronics layer 120 shown in FIG. 3A in the following ways. The electronics system 121 is buried in the substrate 122. The electronic layer 120 does not comprise one or more electric contacts 125 on the first surface 124. Instead, the substrate 122 including the buried electronics system 121 is bonded to the X-ray absorption layer 110 by direct bonding. Holes are formed in the substrate 123 and filled with metal to form the vias 126A that electrically route the electrical contact 119B to the second surface 128 and to form the vias 126B that electrically route the electronics system 121 to the second surface 128. The RDL 123 is then formed on the second surface 128 such that the transmission lines 127 electrically connect the vias 126A and 126B to complete the electrical connection from the electrical contact 119B to the electronics system 121. The X-ray absorption layer 110 may include multiple discrete chips. Each of the chips may be bonded to the electronic layer 120 individually or collectively. The X-ray absorption layer 110 including multiple discrete chips may help to accommodate the difference between the thermal expansion coefficients of the materials of the X-ray absorption layer 110 and the electronic layer 120.

Figure 4A:
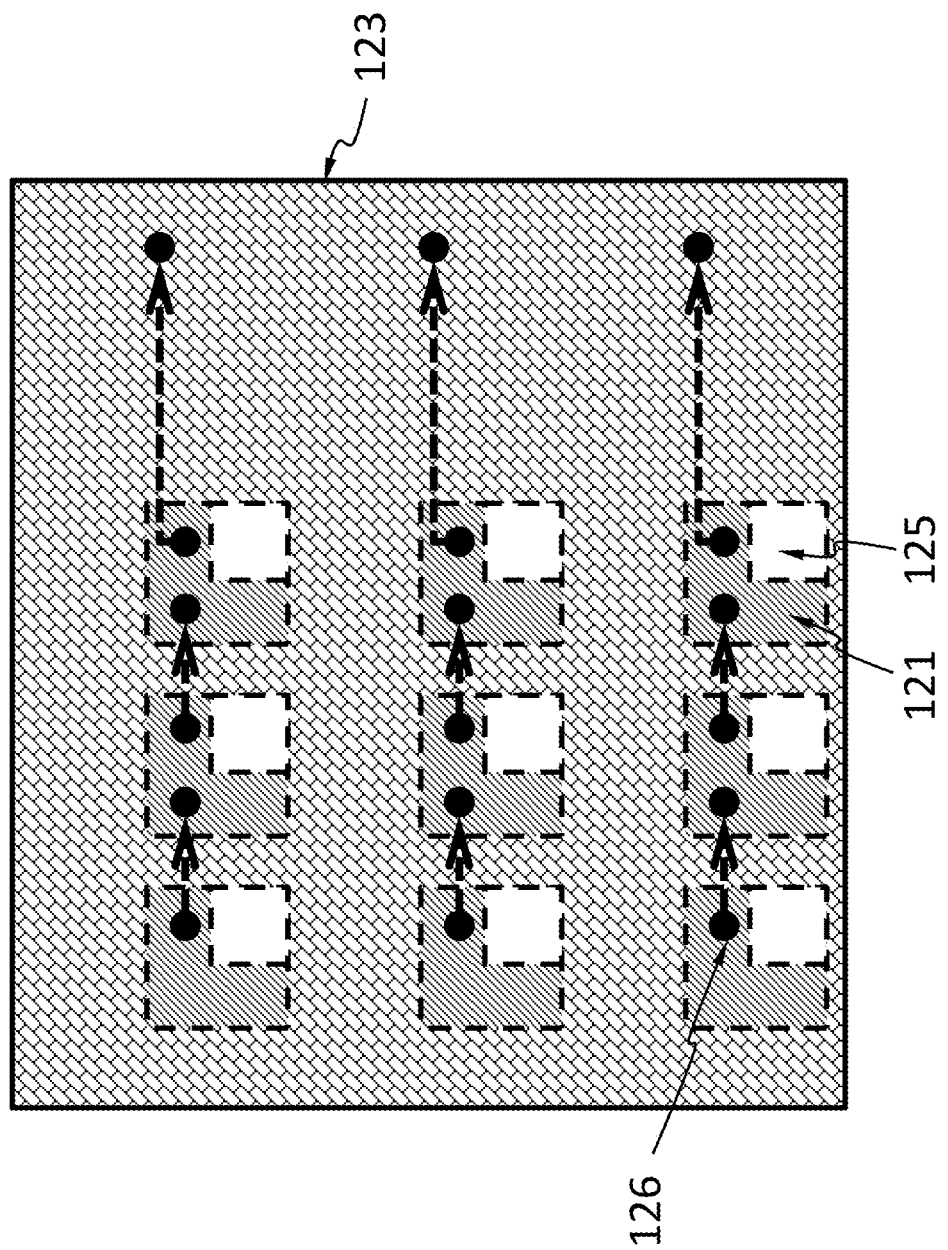
FIG. 4A shows a top view of the RDL in FIG. 3A, according to an embodiment.

Signal from the electric contacts 125 may be read out column by column. For example, signal from one electric contact 125 may be stored in register in the electronics system 121 associated with it; the signal may be successively shifted from one column to the next, and eventually to other processing circuitry. If the RDL 123 exists, FIG. 4A shows a top view of the RDL 123 in FIG. 3A to illustrate the positions of the vias 125 and the transmission lines 127, relative to the electric contacts 125 and the electronics system 121, according to an embodiment. The electric contacts 125, the electronics system 121 and the transmission lines 127 are shown in dotted lines because they are not directly visible in this view.

Figure 4B:
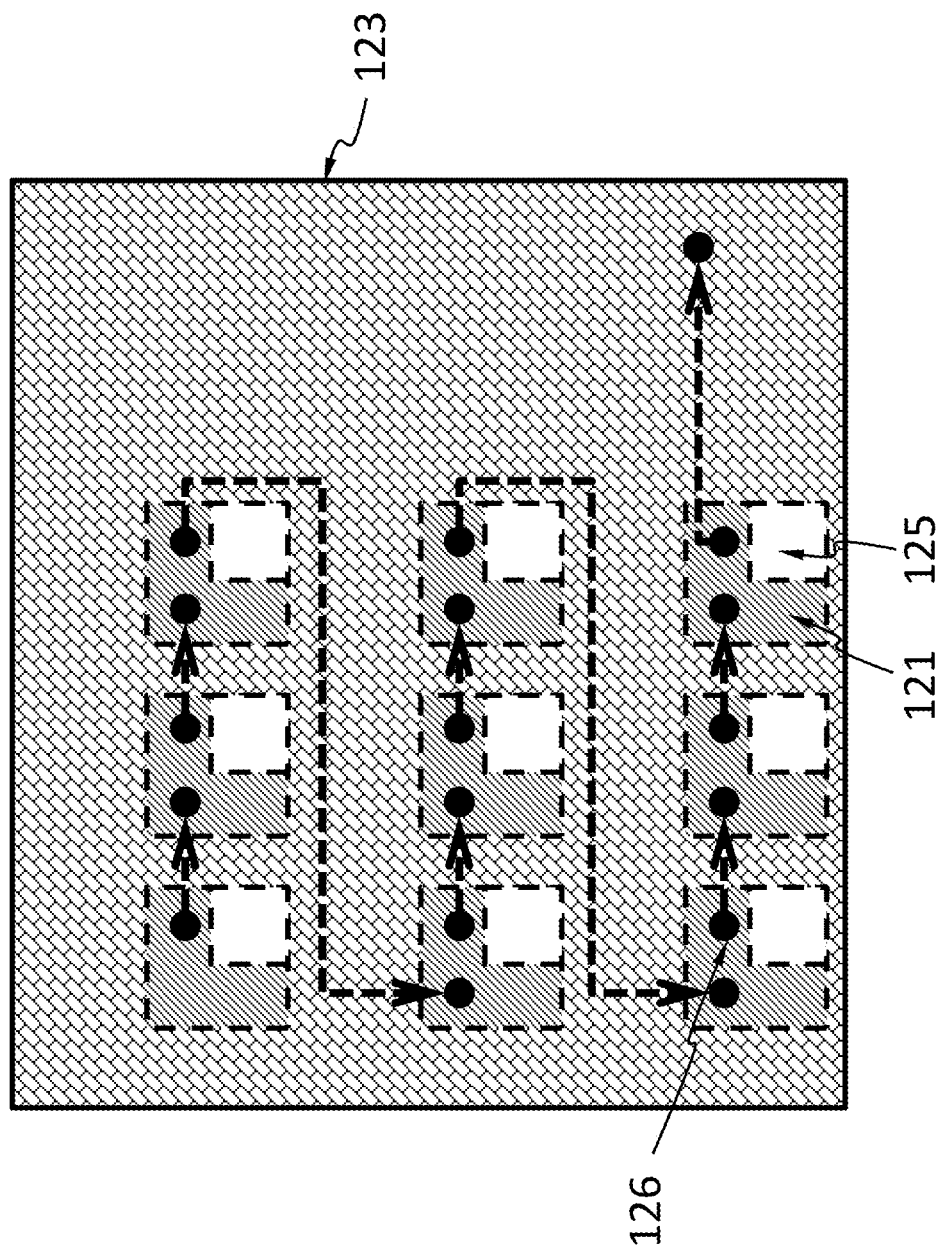
FIG. 4B shows a top view of the RDL in FIG. 3A, according to an embodiment.

Signal from the electric contacts 125 may be read out pixel by pixel. For example, signal from one electric contact 125 may be stored in register in the electronics system 121 associated with it; the signal may be successively shifted from one electric contact 125 to the next, and eventually to other processing circuitry. If the RDL 123 exists, FIG. 4B shows a top view of the RDL 123 in FIG. 3A to illustrate the positions of the vias 125 and the transmission lines 127, relative to the electric contacts 125 and the electronics system 121, according to an embodiment. The electric contacts 125, the electronics system 121 and the transmission lines 127 are shown in dotted lines because they are not directly visible in this view.

Figure 5A:
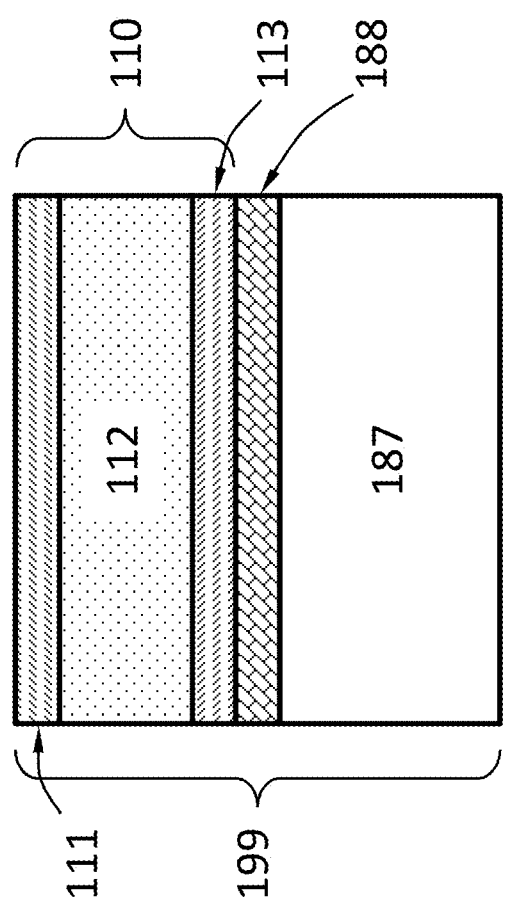
FIGS. 5A-5D schematically show a flow of making the X-ray absorption layer, according to an embodiment.

FIGS. 5A-5D schematically show a flow of making the X-ray absorption layer 110, according to an embodiment. FIG. 5A schematically shows that the flow starts with a substrate 199 having a sacrificial layer 187, an etch stop layer 188, the first doped region 111, the second doped region 113 and the intrinsic region 112. The regions 111, 112 and 113 are described above. The regions 112 and 113, and the optional region 111 may function as the X-ray absorption layer 110. The regions 111, 112 and 113 may be layers epitaxially grown on the etch stop layer 188. In one example, the sacrificial layer 187 is a GaAs wafer. The second doped region 113 is an N type GaAs epitaxial layer, which may have a thickness of about 5 microns. The intrinsic region 112 may be an intrinsic GaAs epitaxial layer with a thickness of less than 75 microns, less than 100 microns, less than 125 microns, or less than 200 microns. Alternatively, the intrinsic region 112 may be replaced with a lightly doped P type layer or a lightly doped N type layer. "Lightly doped" means that the energy levels of the dopants do not merge into an impurity band. In contrast, "heavily doped" means that the energy levels of the dopants merge into an impurity band. The first doped region 111 may be a heavily doped P type GaAs epitaxial layer with a thickness of 1 micron or more. In an embodiment, the first doped region 111 may be omitted.

Figure 5B:
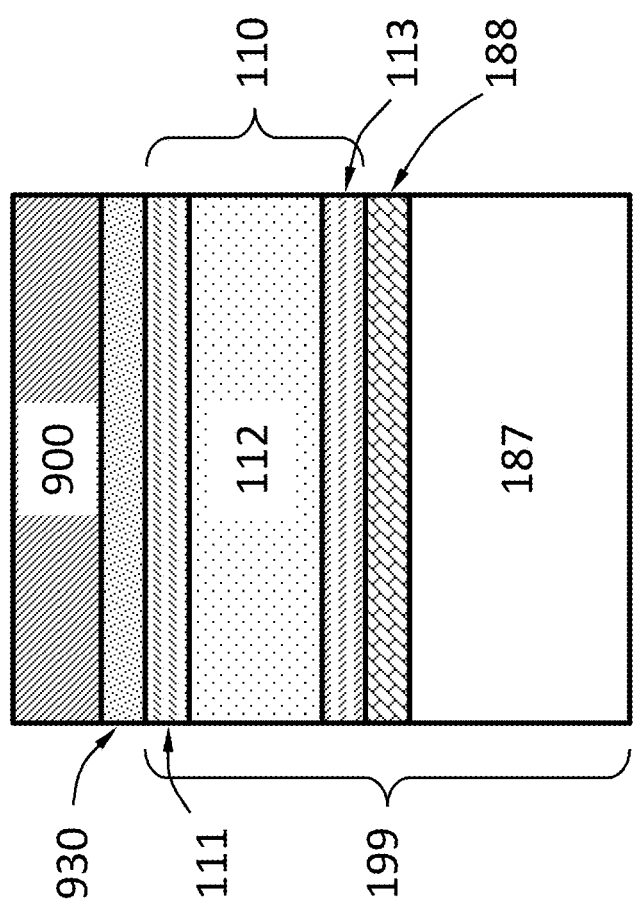

FIG. 5B schematically shows that the substrate 199 is attached to a substrate 900. There may be a metal layer 930 to form electrical contact to the first doped region 111 if the first doped region 111 is present, or to the intrinsic region 112 if the first doped region 111 is absent.

The substrate 900 may be a material that has a low (e.g., <1000 m$^2$/kg) mass attenuation coefficient for the X-ray energy of interest. Examples of such a material may include silicon, silicon oxide, Al, Cr, Ti, etc. The substrate 900 does not have to be a single material. In one example, the substrate 900 may include a body of silicon and the surface contacting the X-ray absorption layer 110 may be a metal layer. In another example, the substrate 900 is a silicon wafer and the surface contacting the X-ray absorption layer 110 is heavily doped silicon. In another example, the substrate 900 is a glass wafer and the surface contacting the X-ray absorption layer 110 is a metal layer. The substrate 900 may have a sufficient strength to provide mechanical support to the X-ray absorption layer 110 during subsequent fabrication processes. The surface contacting the X-ray absorption layer 110 may be an electrically conductive material such as heavily doped silicon, Al, Cr, Ti, etc. The substrate 900 may be configured to be electrically connected to or serve as the electrical contacts 119A of the X-ray absorption layer 110.

Figure 5C:
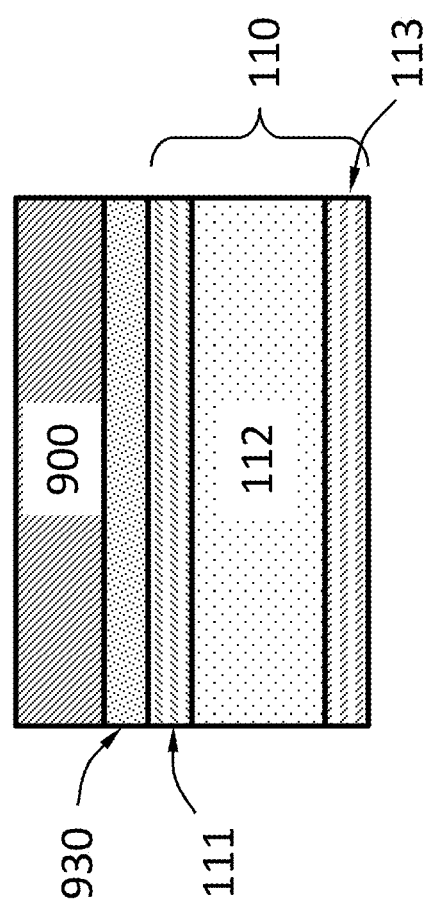

FIG. 5C schematically shows that the sacrificial layer 187 is removed by etching. Etching is stopped by the etch stop layer 188. Even if the regions 111-113 may be of the same material as the sacrificial layer 187, the etch stop layer 188 prevents etching of the regions 111-113 while allows etching of the sacrificial layer 187. The etch stop layer 188 may be subsequently removed.

Figure 5D:
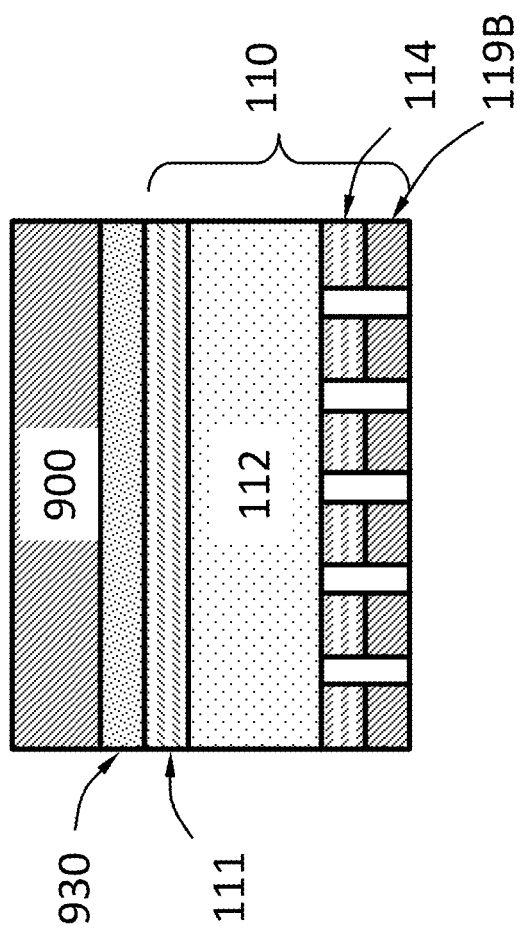

FIG. 5D schematically shows that the discrete regions 114 and the electrical contacts 119B may be formed partially from the second doped region 113. The electronics layer 120 may then be attached to the chip 189 as described above.

Figure 6A:
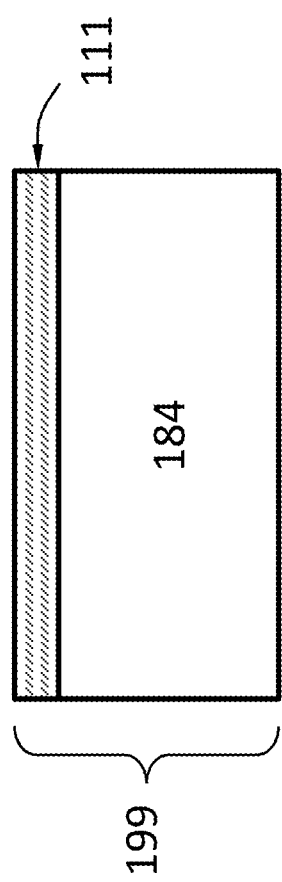
FIGS. 6A-6D schematically show a flow of making the X-ray absorption layer, according to an embodiment.

FIGS. 6A-6D schematically show a flow of making the X-ray absorption layer 110, according to an embodiment. FIG. 6A schematically shows that the flow may start with a substrate 199 having an intrinsic or lighted doped layer 184 and optionally the first doped region 111. The region 111 is described above. In one example, the layer 184 is a GaAs wafer. The layer 184 may be intrinsic or lighted doped P type GaAs. The first doped region 111 may be a heavily doped P type GaAs epitaxial layer with a thickness of 1 micron or more. In an embodiment, the first doped region 111 may be omitted.

Figure 6B:
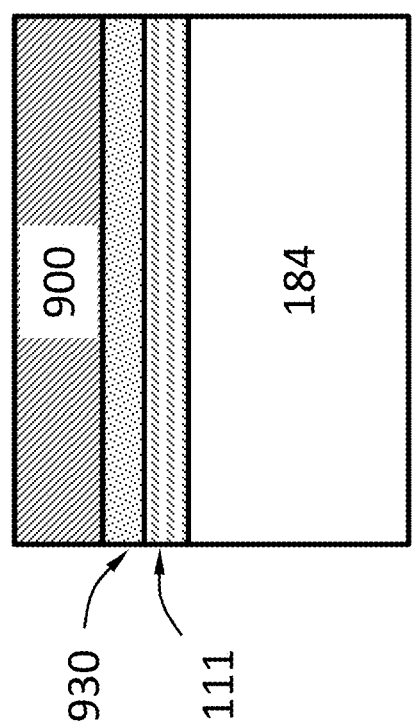

FIG. 6B schematically shows that the chip 189 is attached to a substrate 900. There may be a metal layer 930 to form electrical contact to the first doped region 111 if the first doped region 111 is present, or to the layer 184 if the first doped region 111 is absent.

The substrate 900 may be a material that has a low (e.g., <1000 m$^2$/kg) mass attenuation coefficient for the X-ray energy of interest. Examples of such a material may include silicon, silicon oxide, Al, Cr, Ti, etc. The substrate 900 does not have to be a single material. In one example, the substrate 900 may include a body of silicon and the surface contacting the X-ray absorption layer 110 may be a metal layer. In another example, the substrate 900 is a silicon wafer and the surface contacting the X-ray absorption layer 110 is heavily doped silicon. In another example, the substrate 900 is a glass wafer and the surface contacting the X-ray absorption layer 110 is a metal layer. The substrate 900 may have a sufficient strength to provide mechanical support to the X-ray absorption layer 110 during subsequent fabrication processes. The surface contacting the X-ray absorption layer 110 may be an electrically conductive material such as heavily doped silicon, Al, Cr, Ti, etc. The substrate 900 may be configured to be electrically connected to or serve as the electrical contacts 119A of the X-ray absorption layer 110.

Figure 6C:
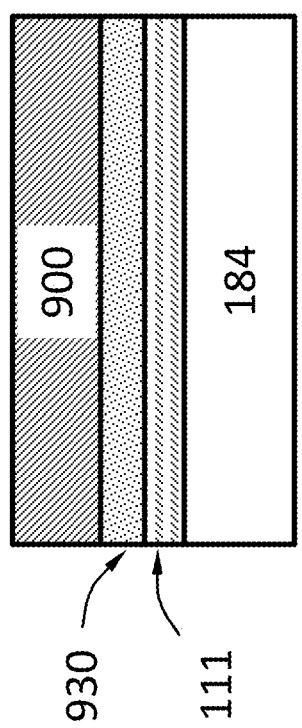

FIG. 6C schematically shows that the layer 184 is thinned by a suitable method such as grinding, to a suitable thickness of less than 75 microns, less than 100 microns, less than 125 microns, or less than 200 microns.

Figure 6D:
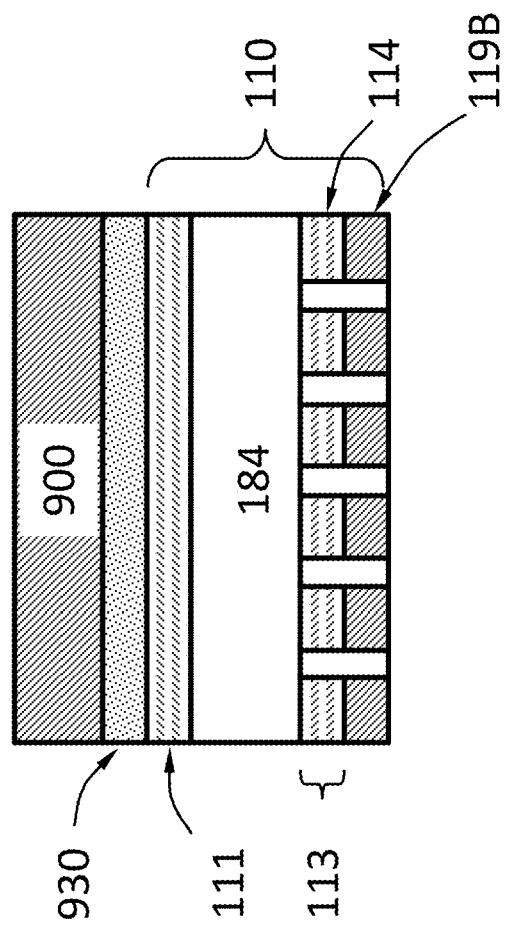

FIG. 6D schematically shows that the second doped region 113 may be disposed onto the layer 184. The layer 184, the second doped region 113, and the optional first doped region 111 may function as the X-ray absorption layer 110. The discrete regions 114 and the electrical contacts 119B may be formed partially from the second doped region 113. The electronics layer 120 may then be attached to the chip 189 as described above.

The X-ray absorption layer 110 as made by the flow of FIGS. 5A-5D or the flow of FIGS. 6A-6D may be bonded to the electronic layer 120 using a suitable method such that in FIG. 3A, 3B or 3C.

Figure 7A:
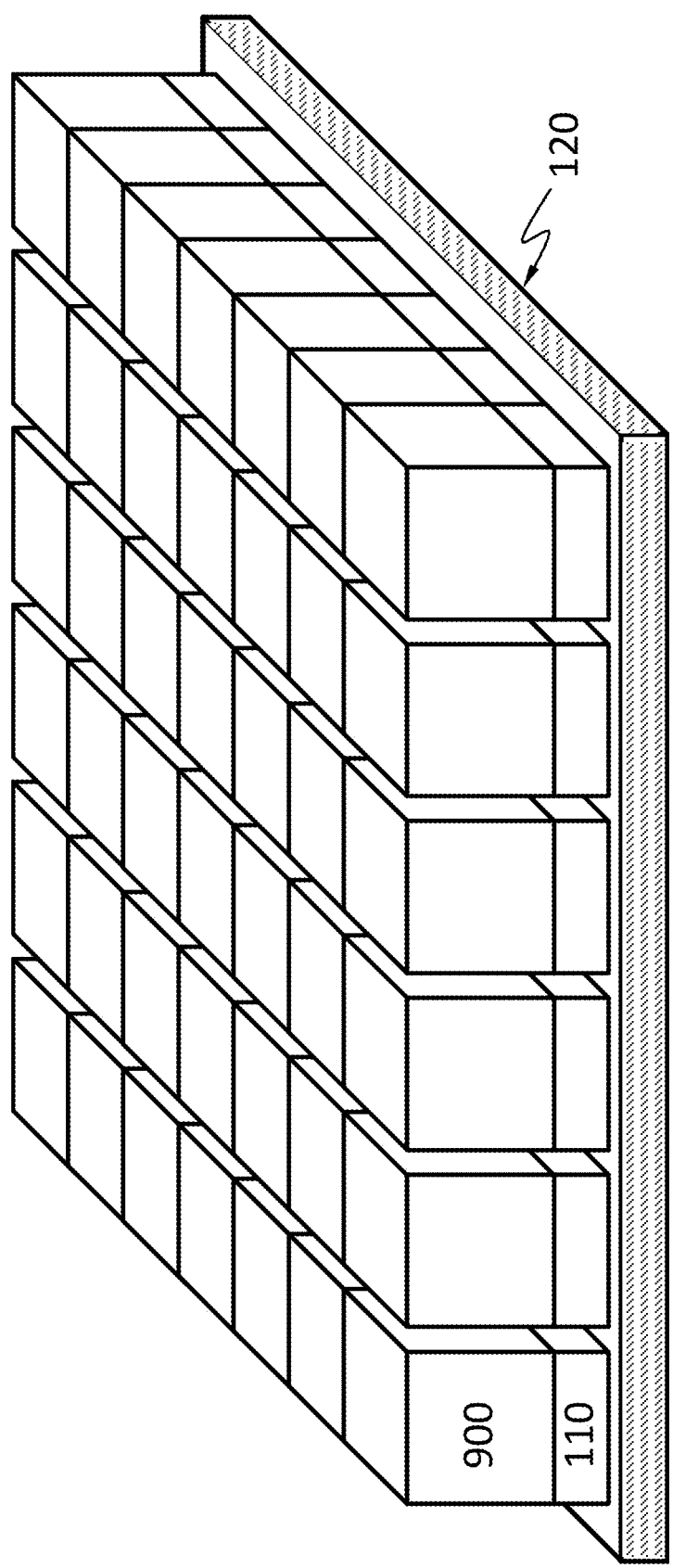
FIG. 7A shows that multiple chips may be bonded to a single electronic layer, where each chip may include an X-ray absorption layer, according to an embodiment.

FIG. 7A shows that multiple chips may be bonded to a single electronic layer 120, where each chip may include an X-ray absorption layer 110, according to an embodiment. The smaller sizes of the chips relative to the electronic layer 120 may help accommodating the difference in thermal expansion coefficients of the chips and the electronic layer 120. A ratio between the thermal expansion coefficient of the chips and the thermal expansion coefficient of the electronic layer 120 may be two or more. Bonding multiple chips onto a single electronic layer 120 may yield a large area detector.

Figure 7B:
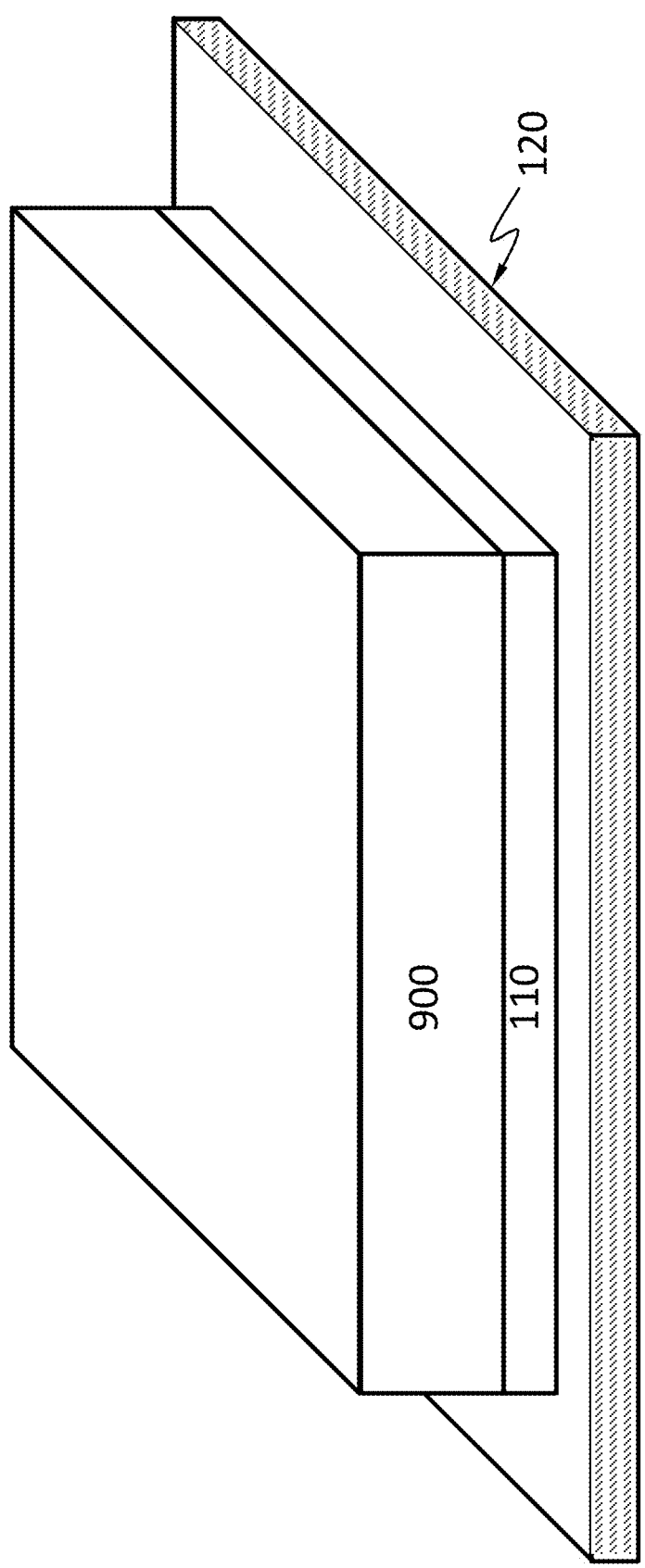
FIG. 7B shows that a single X-ray absorption layer may be bonded to a single electronic layer, according to an embodiment.

FIG. 7B shows that a single X-ray absorption layer 110 may be bonded to a single electronic layer 120, according to an embodiment. FIG. 7B is especially suitable for applications (e.g., intraoral X-ray applications) where the size of the detector does not have to be large.

Figure 8:
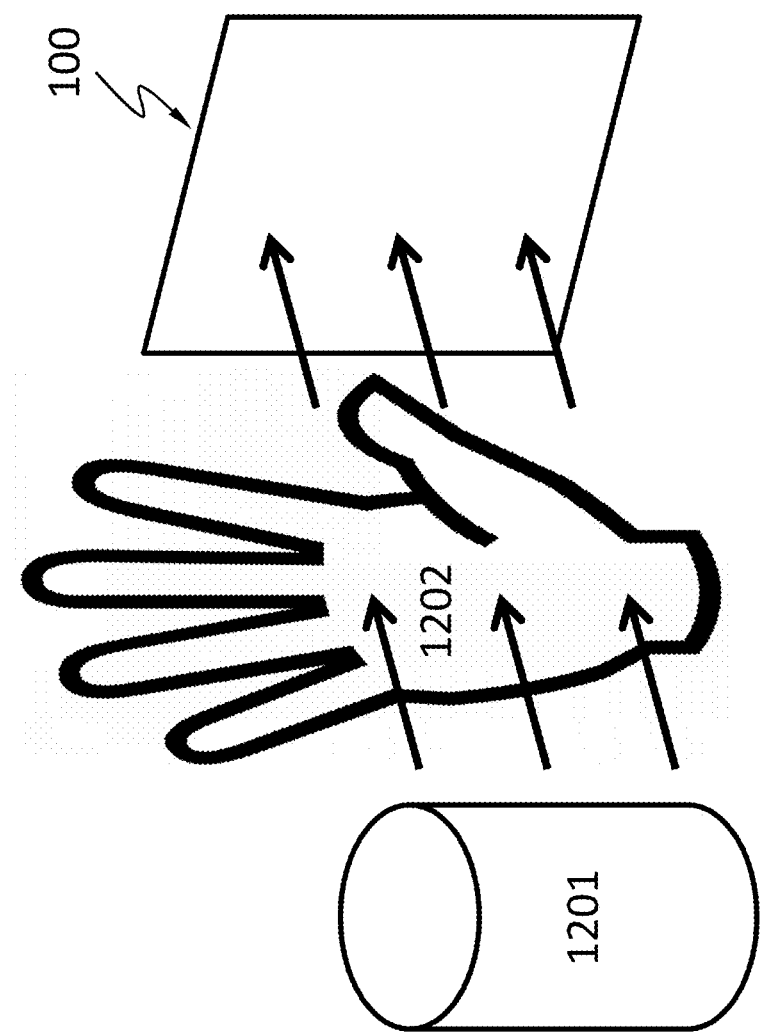
FIG. 8 schematically shows a system comprising the semiconductor X-ray detector described herein, suitable for medical imaging such as chest X-ray radiography, abdominal X-ray radiography, etc., according to an embodiment FIG. 9 schematically shows a system comprising the semiconductor X-ray detector described herein suitable for dental X-ray radiography, according to an embodiment.

FIG. 8 schematically shows a system comprising the semiconductor X-ray detector 100 described herein. The system may be used for medical imaging such as chest X-ray radiography, abdominal X-ray radiography, etc. The system comprises an X-ray source 1201. X-ray emitted from the X-ray source 1201 penetrates an object 1202 (e.g., a human body part such as chest, limb, abdomen), is attenuated by different degrees by the internal structures of the object 1202 (e.g., bones, muscle, fat and organs, etc.), and is projected to the semiconductor X-ray detector 100. The semiconductor X-ray detector 100 forms an image by detecting the intensity distribution of the X-ray.

Figure 9:
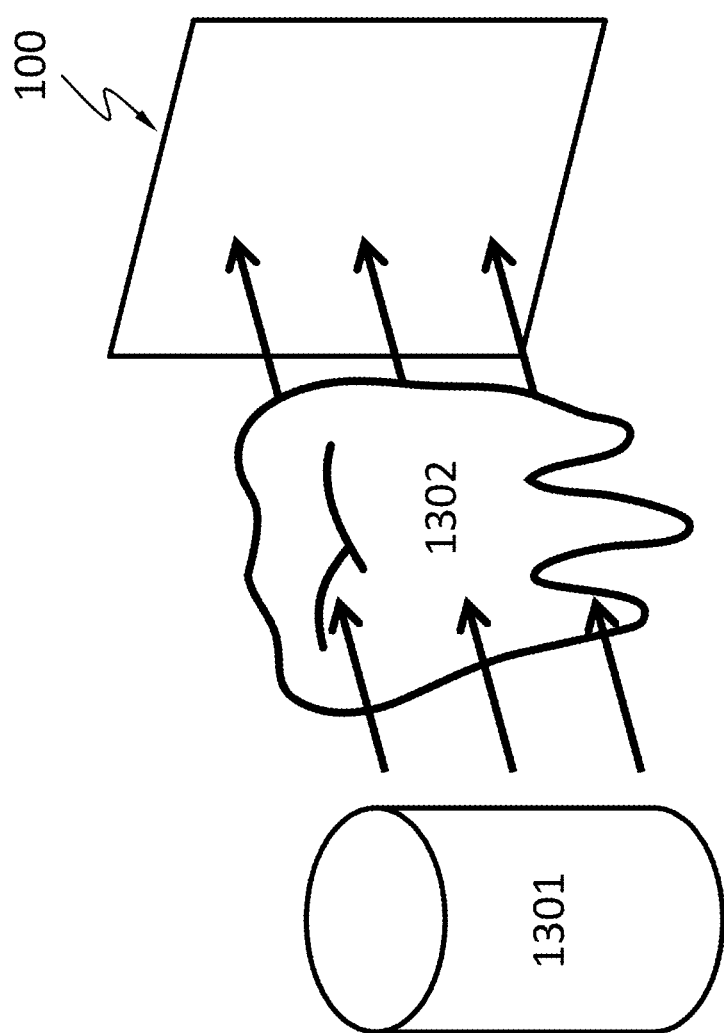

FIG. 9 schematically shows a system comprising the semiconductor X-ray detector 100 described herein. The system may be used for medical imaging such as dental X-ray radiography. The system comprises an X-ray source 1301. X-ray emitted from the X-ray source 1301 penetrates an object 1302 that is part of a mammal (e.g., human) mouth. The object 1302 may include a maxilla bone, a palate bone, a tooth, the mandible, or the tongue. The X-ray is attenuated by different degrees by the different structures of the object 1302 and is projected to the semiconductor X-ray detector 100. The semiconductor X-ray detector 100 forms an image by detecting the intensity distribution of the X-ray. Teeth absorb X-ray more than dental caries, infections, periodontal ligament. The dosage of X-ray radiation received by a dental patient is typically small (around 0.150 mSv for a full mouth series).

Figure 10:
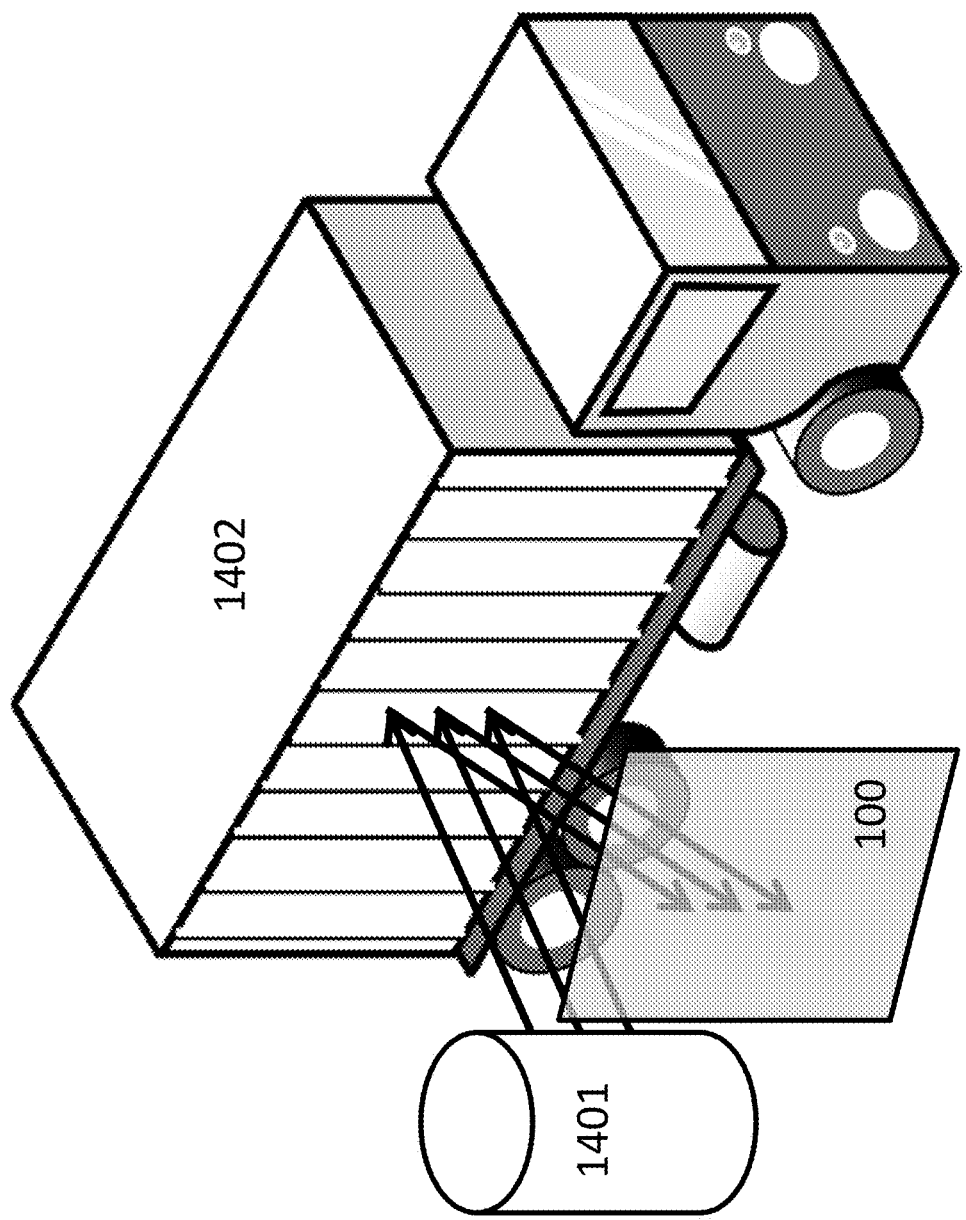
FIG. 10 schematically shows a cargo scanning or non-intrusive inspection (NII) system comprising the semiconductor X-ray detector described herein, according to an embodiment.

FIG. 10 schematically shows a cargo scanning or non-intrusive inspection (NII) system comprising the semiconductor X-ray detector 100 described herein. The system may be used for inspecting and identifying goods in transportation systems such as shipping containers, vehicles, ships, luggage, etc. The system comprises an X-ray source 1401. X-ray emitted from the X-ray source 1401 may backscatter from an object 1402 (e.g., shipping containers, vehicles, ships, etc.) and be projected to the semiconductor X-ray detector 100. Different internal structures of the object 1402 may backscatter X-ray differently. The semiconductor X-ray detector 100 forms an image by detecting the intensity distribution of the backscattered X-ray and/or energies of the backscattered X-ray photons.

Figure 11:
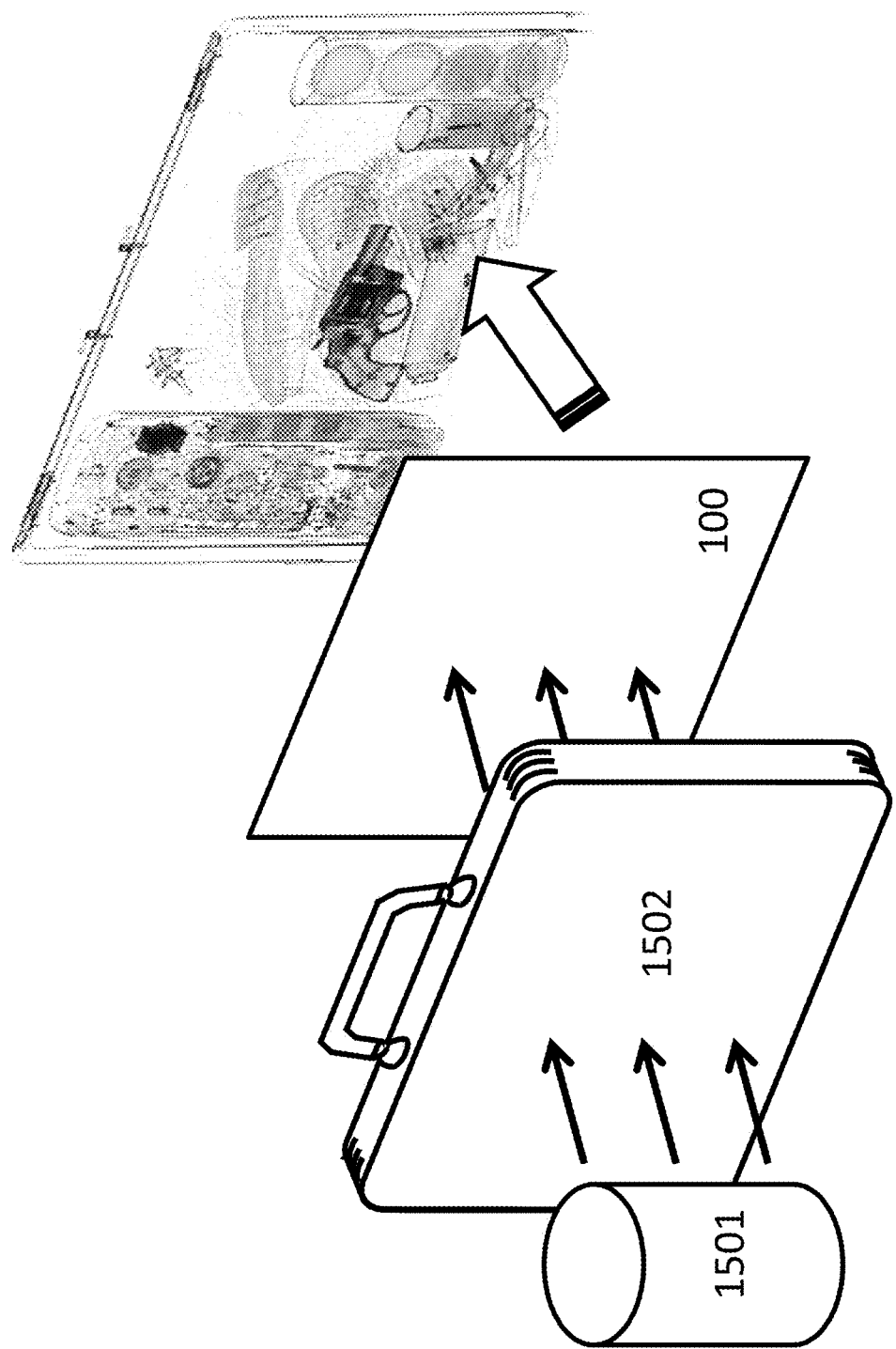
FIG. 11 schematically shows another cargo scanning or non-intrusive inspection (NII) system comprising the semiconductor X-ray detector described herein, according to an embodiment.

FIG. 11 schematically shows another cargo scanning or non-intrusive inspection (NII) system comprising the semiconductor X-ray detector 100 described herein. The system may be used for luggage screening at public transportation stations and airports. The system comprises an X-ray source 1501. X-ray emitted from the X-ray source 1501 may penetrate a piece of luggage 1502, be differently attenuated by the contents of the luggage, and projected to the semiconductor X-ray detector 100. The semiconductor X-ray detector 100 forms an image by detecting the intensity distribution of the transmitted X-ray. The system may reveal contents of luggage and identify items forbidden on public transportation, such as firearms, narcotics, edged weapons, flammables.

Figure 12:
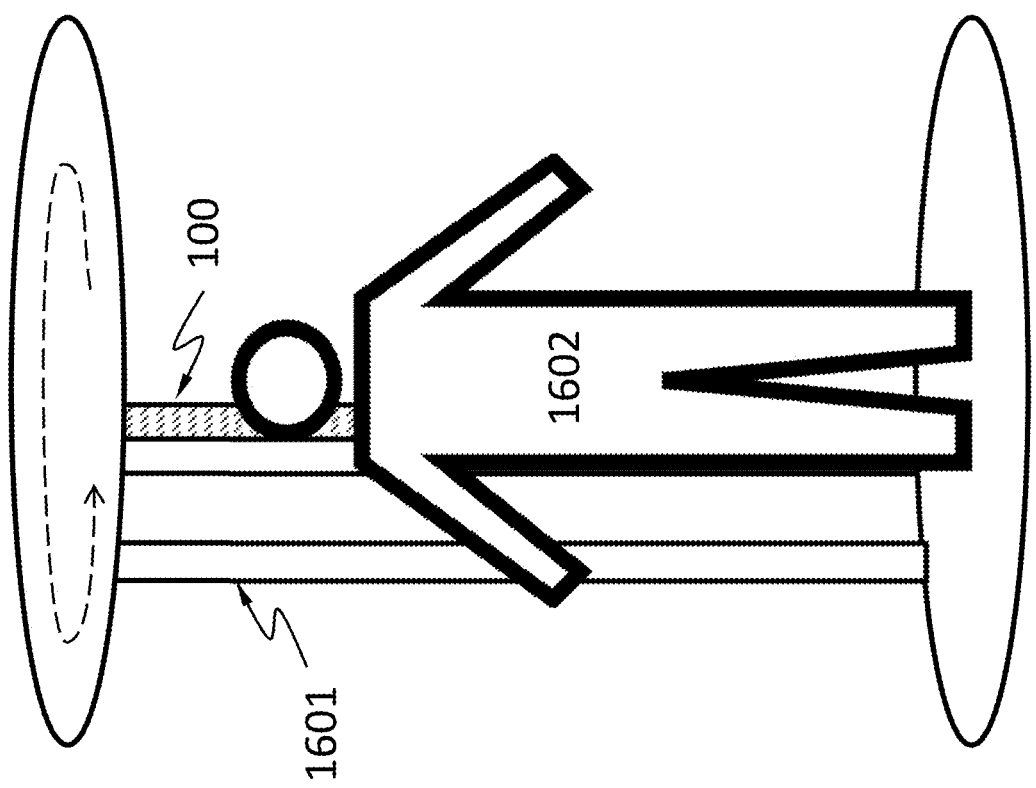
FIG. 12 schematically shows a full-body scanner system comprising the semiconductor X-ray detector described herein, according to an embodiment.

FIG. 12 schematically shows a full-body scanner system comprising the semiconductor X-ray detector 100 described herein. The full-body scanner system may detect objects on a person's body for security screening purposes, without physically removing clothes or making physical contact. The full-body scanner system may be able to detect nonmetal objects. The full-body scanner system comprises an X-ray source 1601. X-ray emitted from the X-ray source 1601 may backscatter from a human 1602 being screened and objects thereon, and be projected to the semiconductor X-ray detector 100. The objects and the human body may backscatter X-ray differently. The semiconductor X-ray detector 100 forms an image by detecting the intensity distribution of the backscattered X-ray. The semiconductor X-ray detector 100 and the X-ray source 1601 may be configured to scan the human in a linear or rotational direction.

Figure 13:
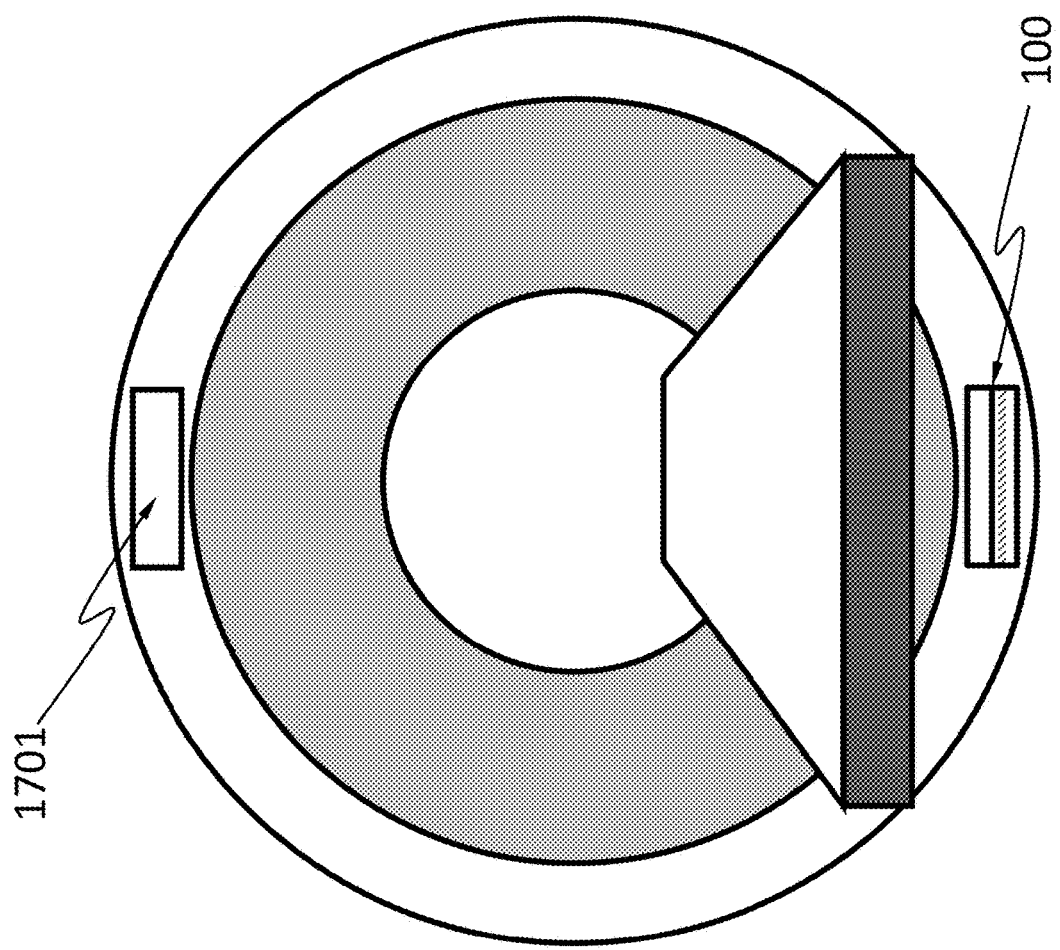
FIG. 13 schematically shows an X-ray computed tomography (X-ray CT) system comprising the semiconductor X-ray detector described herein, according to an embodiment.

FIG. 13 schematically shows an X-ray computed tomography (X-ray CT) system. The X-ray CT system uses computer-processed X-rays to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The X-ray CT system comprises the semiconductor X-ray detector 100 described herein and an X-ray source 1701. The semiconductor X-ray detector 100 and the X-ray source 1701 may be configured to rotate synchronously along one or more circular or spiral paths.

Figure 14:
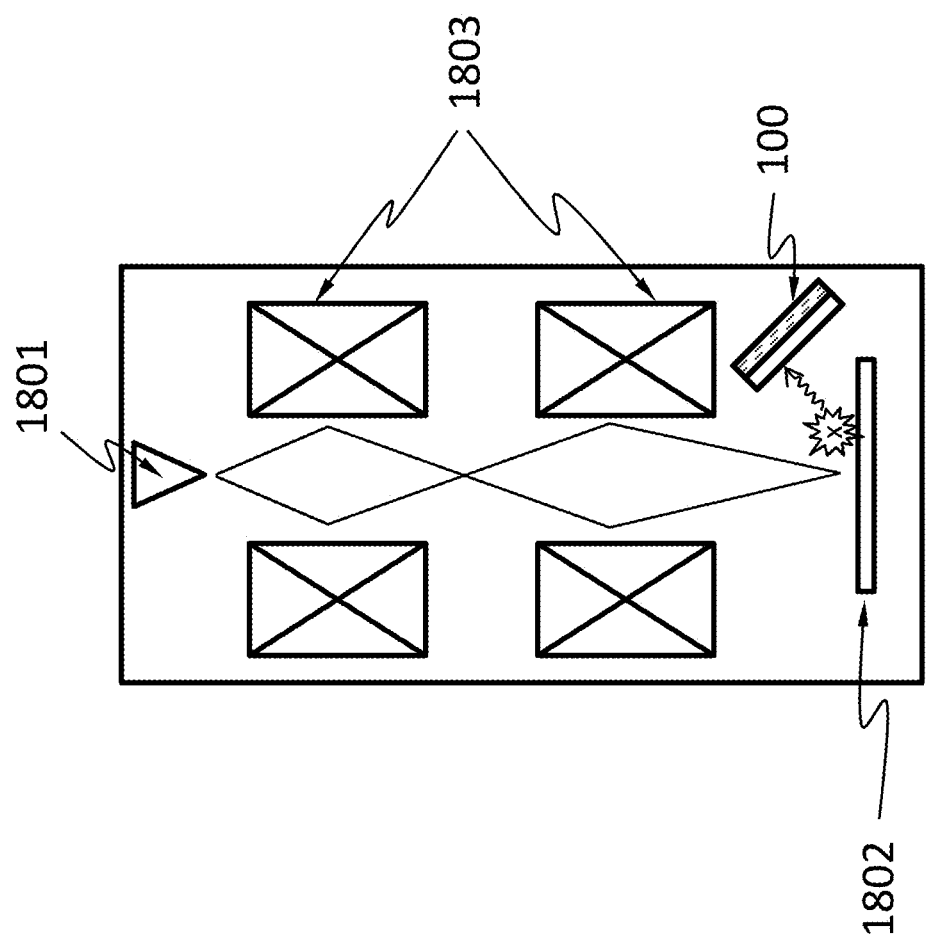
FIG. 14 schematically shows an electron microscope comprising the semiconductor X-ray detector described herein, according to an embodiment.

FIG. 14 schematically shows an electron microscope. The electron microscope comprises an electron source 1801 (also called an electron gun) that is configured to emit electrons. The electron source 1801 may have various emission mechanisms such as thermionic, photocathode, cold emission, or plasmas source. The emitted electrons pass through an electronic optical system 1803, which may be configured to shape, accelerate, or focus the electrons. The electrons then reach a sample 1802 and an image detector may form an image therefrom. The electron microscope may comprise the semiconductor X-ray detector 100 described herein, for performing energy-dispersive X-ray spectroscopy (EDS). EDS is an analytical technique used for the elemental analysis or chemical characterization of a sample. When the electrons incident on a sample, they cause emission of characteristic X-rays from the sample. The incident electrons may excite an electron in an inner shell of an atom in the sample, ejecting it from the shell while creating an electron hole where the electron was. An electron from an outer, higher-energy shell then fills the hole, and the difference in energy between the higher-energy shell and the lower energy shell may be released in the form of an X-ray. The number and energy of the X-rays emitted from the sample can be measured by the semiconductor X-ray detector 100.

The semiconductor X-ray detector 100 described here may have other applications such as in an X-ray telescope, X-ray mammography, industrial X-ray defect detection, X-ray microscopy or microradiography, X-ray casting inspection, X-ray non-destructive testing, X-ray weld inspection, X-ray digital subtraction angiography, etc. It may be suitable to use this semiconductor X-ray detector 100 in place of a photographic plate, a photographic film, a PSP plate, an X-ray image intensifier, a scintillator, or another semiconductor X-ray detector.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus comprising:
   an X-ray absorption layer;
   a first electrical contact and a second electrical contact on opposing surfaces of the X-ray absorption layer;
   wherein the first electrical contact and the second electrical contact respectively comprise structures extending into the X-ray absorption layer.

2. The apparatus of claim 1, wherein the structures are holes filled with a metal.

3. The apparatus of claim 1, wherein the structures form an Ohmic contact with materials of the X-ray absorption layer.

4. The apparatus of claim 1, wherein the structures form a Schottky contact with materials of the X-ray absorption layer.

5. The apparatus of claim 1, wherein the structures of the first electrical contact and the structures of the second electrical contact form an interdigitate pattern.

6. The apparatus of claim 1, wherein the structures of the first electrical contact and the structures of the second electrical contact do not electrically short.

7. The apparatus of claim 1, wherein each of the structures of the first electrical contact is spaced by a distance less than 100 μm from the nearest one of the structures of the second electrical contact.

8. The apparatus of claim 1, wherein the structures of the first electrical contact and the structures of the second electrical contact are configured to collect charge carriers generated in the X-ray absorption layer from X-ray photons.

9. An apparatus comprising:
   an X-ray absorption layer;
   an electronics layer comprising a substrate and an electronic system;
   wherein the electronic system is configured to process or interpret signals generated by X-ray photons incident on the X-ray absorption layer, and is buried in the substrate;
   wherein the substrate has a first surface and a second surface opposing the first surface;
   wherein the electronics layer comprises a redistribution layer (RDL) on the second surface, the RDL comprising transmission lines;

wherein the electronics layer comprises first vias extending from the first surface to the second surface, and electrically connected to the transmission lines;

wherein the electronics layer comprises second vias extending from the second surface, and electrically connecting the transmission lines to the electronic system.

10. The apparatus of claim 9, wherein the electronics layer comprises electric contacts on the first surface; wherein the first vias are electrically connected to the electric contacts.

11. A method comprising:

bonding an X-ray absorption layer having electrical contacts to a substrate having a first surface and a second surface opposing the first surface, so that the electrical contacts are on the first surface of the substrate;

forming first vias extending from the first surface to the second surface and electrically connected to the electrical contacts;

forming second vias extending from the second surface and electrically connected to an electric system buried in the substrate;

forming a redistribution layer (RDL) on the second surface, the RDL comprising transmission lines connected to the first vias and the second vias.

12. The method of claim 11, wherein forming the first vias or the second vias comprises forming holes in the substrate and filling the holes with a metal.

13. The method of claim 11, wherein the substrate comprises electric contacts on the first surface; wherein the first vias are electrically connected to the electric contacts.

* * * * *